United States Patent [19]

Ounuma

[11] Patent Number: 4,641,282

[45] Date of Patent: Feb. 3, 1987

[54] MEMORY SYSTEM

[75] Inventor: Shouji Ounuma, Tokyo, Japan

[73] Assignee: Tokyo Shbaura Denki Kabushiki Kaisha, Kawasaki, Japan

[21] Appl. No.: 497,676

[22] Filed: May 24, 1983

[30] Foreign Application Priority Data

May 31, 1982 [JP] Japan .................................. 57-92861

[51] Int. Cl.[4] ............................ G11C 7/00; G09B 1/28

[52] U.S. Cl. ..................................... 365/189; 365/230; 340/703

[58] Field of Search .................. 340/703, 750; 358/75, 358/160; 364/518, 521; 365/189, 220, 230

[56] References Cited

U.S. PATENT DOCUMENTS 3,473,160 10/1969 Wahlstrom .......................... 340/750

4,016,544 4/1977 Morita et al. ........................ 340/703

4,149,184 4/1979 Giddings et al. ............... 340/703 X 4,150,364 4/1979 Baltzer ................................ 340/703

OTHER PUBLICATIONS

"Dedicated VLSI Chip Lightens Graphics Display Design Load", by Gary DePalma et al, *Computer Graphics,* Article Reprint, AR-255, Jan. 1983.

Data Sheet GDC uPD 7220, Mar. 26, 1982, Nippon Electronics Co., Ltd., IEM-734C.

*Primary Examiner*—Joseph A. Popek

*Attorney, Agent, or Firm*—Cushman,Darby & Cushman

[57] ABSTRACT

A memory system is used in a display or printing system for displaying or printing a picture pattern by processing picture data obtained by a function generator. The memory system has memory planes for storing picture data, registers provided in one-to-one relationship with the memory planes for latching the picture data read from the memory planes, and arithmetic logic units provided in one-to-one relationship with the memory planes for performing logical operations on the picture data latched in the registers and obtained by the function generator. The memory system also has an operation mode register storing operation mode data. The arithmetic logic units perform logical operations according to the operation mode data supplied from the operation mode register. The results of the operations are simultaneously written into the respective memory planes.

10 Claims, 9 Drawing Figures

REPLACE

OR

AND

XOR

SET

MEMORY SYSTEM

BACKGROUND OF THE INVENTION

This invention relates to a memory system which is suitable for use in combination with a color graphic display or a color printer.

In recent years the memory capacity of IC memory has increased and the cost has been reduced. This has made it possible to provide a raster scanning color graphic display system which has an IC memory of large capacity, which is compact and inexpensive. Such a color graphic display is schematically shown in FIG. 1. The system comprises a control device 1, a function generator 2, an external interface circuit 3, a memory control circuit 4, bus drivers 5, and three memory planes 6, 7 and 8. The memory planes 6, 7 and 8 are used to store data representing picture patterns of the three primary colors, i.e., red, green and blue, respectively.

Let us assume that a host computer (not shown) provides an instruction through interface 3 that a white circle with radius r and center ($x_1$, $y_1$) be drawn. The control device 1 receives the data representing r and ($x_1$, $y_1$) and then supplies this data to the function generator 2. At the same time, the device 1 instructs the function generator 2 to calculate the coordinates of any point on the circle. The function generator 2 does this calculation and informs the control device 1 of the end of the calculation.

The picture data representing the coordinates of points corresponding to the points on the circle to be drawn are read from the memory plane 6 and supplied to the control device 1. The control device 1 performs a logical operation on the data which represent the coordinates of each point on the circle and the picture data which represent the coordinates of the corresponding point and which have been read from the memory plane 6. The logical operation may be REPLACE operation for drawing a new picture pattern, or SET operation for changing the binary value of a data stored in the memory plane 6 to "1". The result of the logical operation is written into the memory plane 6.

The sequence of operations described in the preceding paragraph are performed on the picture data stored in the other memory planes 7 and 8 also. Hence, some of the picture data stored in each memory plane, which represent the coordinates of the points on the circle to be drawn, are modified. The modified picture data are read from the memory planes 6, 7 and 8 by a display control circuit 9 in synchronism with display timing signals. Thus, they are displayed by a display (not shown), e.g., a CRT, in the form of a white circle.

With the conventional display system described above, it is necessary to perform a logical operation on the data from the function generator and to write the result of the operation into each memory plane. In other words, three similar operations must be effected one after another and the results of these operation must be written into the three memory planes upon completion of the respective logical operations. Hence, the speed at which the whole system operates is inevitably low.

SUMMARY OF THE INVENTION

The object of the present invention is to provide a memory system which has a plurality of memory planes each provided with an operation circuit, whereby logical operations on each of the picture data stored in each memory plane and newly input picture data are performed at the same time in specified modes and the data obtained by the operations are written into the memory planes at the same time.

To achieve the object described above, a memory system according to the invention has a plurality of memory planes storing picture data; memory control means for controlling the writing and reading from the memory planes; and a plurality of operation means provided in one-to-one relationship with the memory planes for performing logical operations on data read from the respective memory planes.

DETAILED DESCRIPTION OF THE PREFERRED EMBODIMENT

Figure 1:
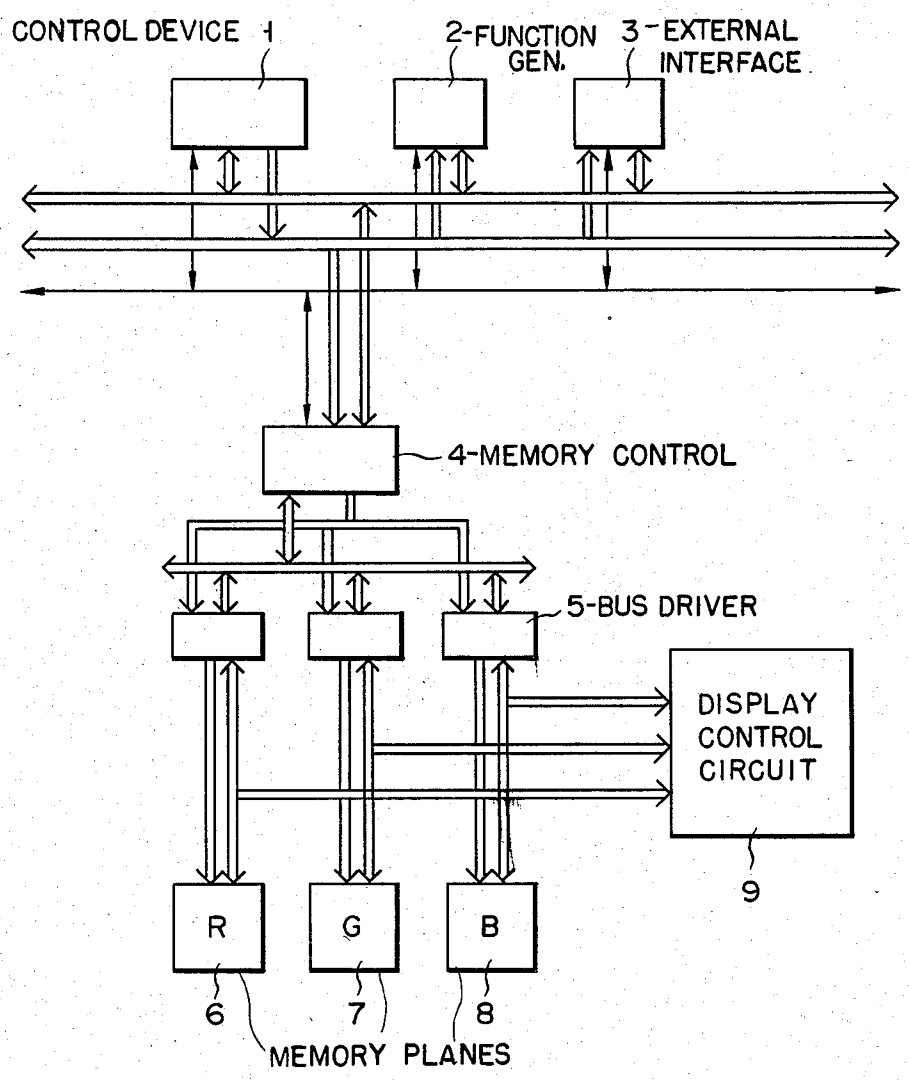
FIG. 1 (PRIOR ART)
FIG. 1 is a block diagram of a known color graphic display system.
Figure 2:
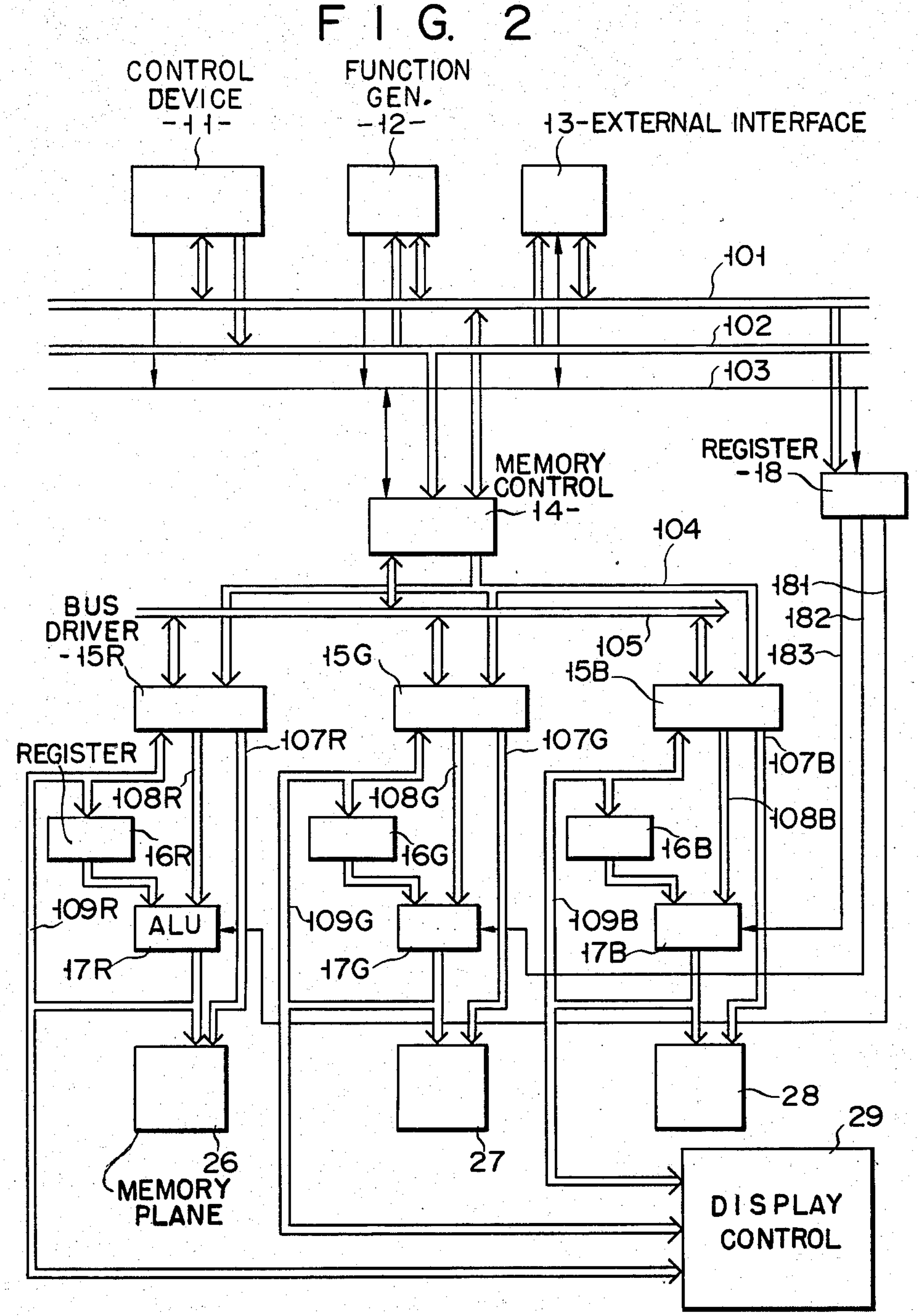
FIG. 2 is a block diagram of one embodiment of the present invention.

As shown in FIG. 2, a control device 11, e.g., a microprocessor, is connected to a data bus 101, an address bus 102 and a control lines 103, as is a function generator 12 and an interface circuit 13 which in turn is also connected to a host computer (not shown). The control device 11, the function generator 12 and the interface circuit 13 perform the same function as their respective counterparts (elements 1, 2, and 3) of the known color graphic display system shown in FIG. 1 and are not therefore described in detail. A memory control circuit 14 is connected to the buses 101 and 102 and the line 103. The output of the memory control circuit 14 is coupled to bus drivers 15R, 15G and 15B through an address bus 104 and a data bus 105.

These bus drivers 15R, 15G and 15B are connected at their outputs to arithmetic logic units (ALUs) 17R, 17G and 17B through data buses 108R, 108G and 108B, respectively, and to memory planes 26, 27 and 28 through address buses 107R, 107G and 107B, respectively. Data read from the memory plane 26 is stored in a register 16R through a data bus 109R. Data read from the memory plane 27 are stored in a register 16G through a data bus 109G. Data read from the memory plane 28 are stored into a register 16B through a data bus 109B. The registers 16R, 16G and 16B have their outputs connected the ALUs 17R, 17G and 17B. The ALU 17R performs a logical operation on the data from the bus driver 15R and register 16R. Similarly, the ALU 17G performs a logical operation on the data from the bus driver 16G and register 16G, and the ALU 17B performs a logical operation on the data from the bus driver 16B and register 16B. Ser. No. 74181 manufactured by Texas Instruments, Inc. may be used as each ALU. The results of operations performed by the ALUs 17R, 17G and 17B are written into the memory planes 26, 27 and 28, respectively. The ALUs 17R, 17G and 17B are connected to the input of a register 18 which stores operation mode data representative of the modes of operations. These operation mode data may be supplied to the ALUs 17R, 17G and 17B through lines 181, 182 and 183, respectively. The operation mode data have been stored in the register 18 from the control device 11 through the data bus 101. The data, i.e., picture data, from the memory planes 26, 27 and 28 are supplied to a display control circuit 29 and displayed by a display (not shown) connected to the display control circuit 29.

Figure 3A:
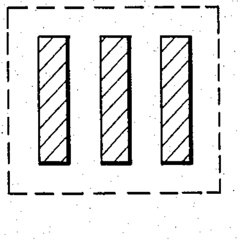
FIG. 3 illustrates various operation modes.
Figure 3B:
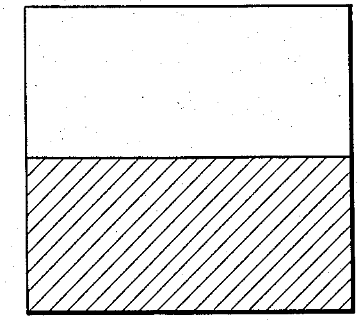
Figure 3C:
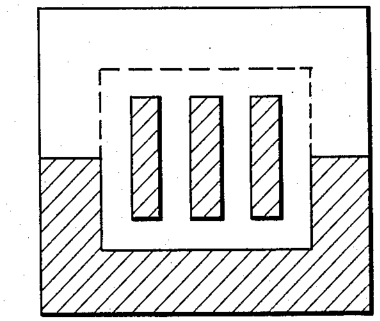
Figure 3D:
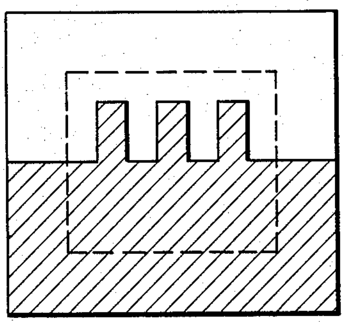
Figure 3E:
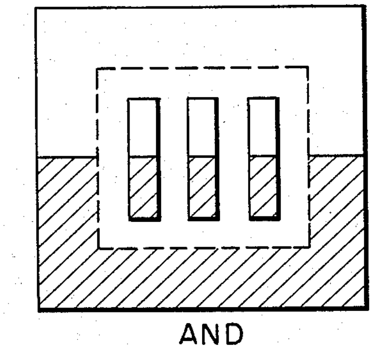
Figure 3F:
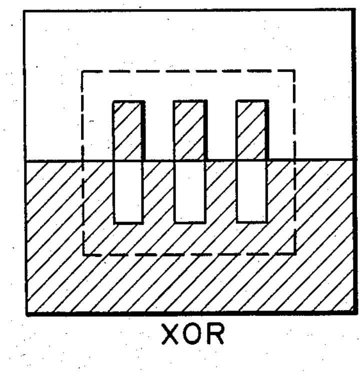
Figure 3G:
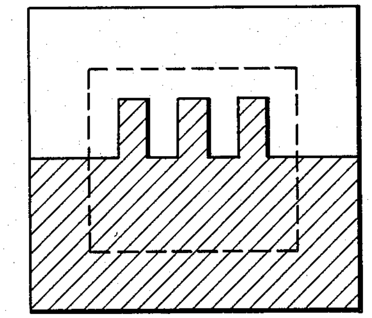

Among the operation modes represented by the data stored in the register 18 are REPLACE mode, OR mode, AND mode, XOR mode and SET mode. When the REPLACE mode is selected, new picture pattern will be drawn, replacing the whole or part of the pattern represented by the data stored in any memory plane. For example, when an operation is conducted on a new picture pattern shown in FIG. 3A and the picture pattern shown in FIG. 3B and stored in any memory plane in the REPLACE mode, a new picture pattern shown in FIG. 3C will be drawn. When the OR mode is selected, the logical sum of the picture data stored in any memory plane and the data representing a new picture pattern will be obtained. When the AND mode is selected, the logical product of the picture data stored in any memory plane and the data representing a new picture pattern will be obtained. Similarly, when the XOR mode is selected, the exclusive logical sum of the picture data stored in any memory plane and the picture data representing a new picture pattern will be obtained. As a result, new patterns shown in FIGS. 3D, 3E and 3F will be drawn when the OR mode, AND mode and XOR mode are selected. When the SET mode is selected, those of the picture data stored in any memory plane which correpond to the logic "1" data of a new picture pattern (i.e., the hatched portions) are changed to logic "1" data and those of the picture data stored in the memory plane which correspond to the logic "0" data of the new picture pattern (i.e., the blank portions) are not changed. As a result, a picture pattern shown in FIG. 3G will be drawn.

The memory planes 26, 27 and 28 are assigned to red pattern data, green pattern data and blue pattern data, respectively.

How the memory system described above operates to draw a white circle having a radius of r and its center at point ($x_1$, $y_1$) will be described in detail.

First, the host computer (not shown) gives an instruction to the control device 11 through the interface circuit 13, thereby instructing the device 11 that a white circle is to be drawn. The circuit 13 gives this instruction to the function generator 12. The function generator 12 starts calculating the coordinates of any point on the circle to be drawn. Upon completion of this calculation, the control device 11 selects the OR mode to thereby draw the white circle and then supplies the coordinates data from the function generator 12 to the memory control device 14 through the data bus 101. Further, the control device 11 supplies address data designating the addresses of the memory planes 26, 27 and 28 to the memory control device 14 through the data bus 102.

The memory control device 14 supplies the address data to the memory planes 26, 27 and 28 through the address bus 104, through the address bus drivers 15R, 15G and 15B and through the address buses 107R, 107G and 107B. Meanwhile, the memory control device 14 supplies the coordinate data to the ALUs 17R, 17G and 17B through the data bus 105, through the address bus drivers 15R, 15G and 15B and through the data buses 108R, 108G and 108B. Picture data are read from those addresses of the memory planes 26, 27 and 28 which are designated by the address data. These picture data are stored into the registers 16R, 16G and 16B via the data buses 109R, 109G and 109B, respectively.

The data representing the OR mode selected by the control device 11 is supplied from the register 18 to the ALUs 17R, 17G and 17B. Also supplied to the ALUs 17R, 17G and 17B are the coordinate data representing the points on the circle to be drawn. The picture patterns are supplied from the registers 16R, 16G and 16B to the ALUs 17R, 17G and 17B, respectively. Therefore, the ALUs 17R, 17G and 17B simultaneously operate according to the OR mode, thereby obtaining the logical sums of the coordinate data and the picture data. The logical products are written into the memory planes 26, 27 and 28 at the same time.

To draw a yellow circle having a radius or r and its center at point ($x_1$, $y_1$), the data representing the OR mode is supplied from the register 18 to the ALU 17R and 17G and the data representing the AND mode is supplied from the register 18 to the ALU 17B.

What is claimed is:

1. A memory system comprising:

a plurality of memory planes for storing picture data;

memory control means for controlling writing and reading data from said plurality of memory planes;

a plurality of operation means coupled in one-to-one relationship with said memory planes for performing logical arithmetic operations on data read from said respective memory planes thereby allowing said logical arithmetic operations to be performed on all of said memory planes simultaneously; and a plurality of first register means coupled in one-to-one relationship with said operation means for holding data from said respective planes.

2. A memory system according to claim 1, further comprising second register means for storing data representing a mode of said logical arithmetic operation of said plurality of operation means.

3. A memory system according to claim 2, wherein one of said operation modes is to draw a new picture pattern represented by newly input picture data.

4. A memory system according to claim 2, wherein one of said operation modes is to obtain a logical sum of the picture data stored in any memory plane and newly input picture data and representing a new picture pattern to be drawn.

5. A memory system according to claim 2, wherein one of said operation modes is to obtain a logical product of the picture data stored in any memory plane and picture data newly input and representing a new picture pattern to be drawn.

6. A memory system according to claim 2, wherein one of said operation modes is to obtain an exclusive logical sum of the picture data stored in any memory plane and picture data newly input and representing a new picture pattern to be drawn.

7. A memory system according to claim 2, wherein one of said operation modes render those of the picture data stored in any memory plane which correspond to one data state of a new picture pattern as said one data and keeps those of the picture data stored in the memory plane which correspond to another data state of the new picture pattern unmodified.

8. A memory system according to claim 1, wherein there are three said memory planes, assigned to picture patterns of the three primary colors, red, green and blue, respectively.

9. A system as in claim 1 wherein said memory control means is a single device which controls all of said plurality of memory planes.

10. A memory system comprising:

a plurality of memory planes for storing picture data;

memory control means for controlling writing and reading data from said plurality of memory planes;

a plurality of operation means coupled in one-to-one relationship with said memory planes for performing logical arithmetic operations on data read from said respective memory planes thereby allowing said logical arithmetic operations to be performed on all of said memory planes simultaneously; and register means for storing data representing a mode of said arithmetic operation of said plurality of operation means.

* * * * *